United States Patent [19]

Juzswik

[11] Patent Number: 5,245,523

[45] Date of Patent: Sep. 14, 1993

[54] POWER DELIVERY CIRCUIT WITH CURRENT DETECTION

[75] Inventor: David L. Juzswik, Dearborn Heights, Mich.

[73] Assignee: United Technologies Automotive, Inc., Dearborn, Mich.

[21] Appl. No.: 746,144

[22] Filed: Aug. 14, 1991

Related U.S. Application Data

[63] Continuation of Ser. No. 376,466, Jul. 5, 1989, abandoned, which is a continuation-in-part of Ser. No. 349,022, May 9, 1989, abandoned.

[51] Int. Cl.$^5$ .............................................. H02H 7/12
[52] U.S. Cl. ...................................... 363/56; 318/599; 323/315; 361/31; 361/93; 363/63
[58] Field of Search ............... 323/284, 315, 316, 277, 323/351; 361/24, 31, 93, 102; 318/599, 434; 363/56, 63

[56] References Cited

U.S. PATENT DOCUMENTS

| | | | |
|---|---|---|---|
| 4,319,181 | 3/1982 | Wrathall | 323/315 |
| 4,454,573 | 6/1984 | Petsch et al. | 363/63 |
| 4,494,181 | 1/1985 | Ramlohr | 363/63 |
| 4,528,496 | 7/1985 | Naokawa et al. | 323/315 |
| 4,532,567 | 7/1985 | Kade | 361/31 |
| 4,562,386 | 12/1985 | Goff et al. | 318/254 |
| 4,575,662 | 3/1986 | Lehnhoff | 318/282 |
| 4,616,305 | 10/1986 | Damiano et al. | 363/132 |
| 4,654,568 | 3/1987 | Mansmann | 318/293 |
| 4,667,121 | 5/1987 | Fay et al. | 307/580 |
| 4,705,997 | 11/1987 | Juzswik | 318/341 |
| 4,710,685 | 12/1987 | Lehnhoff et al. | 318/287 |
| 4,710,686 | 12/1987 | Guzik | 318/293 |
| 4,719,396 | 1/1988 | Shimizu | 318/432 |
| 4,769,619 | 9/1988 | Taylor | 330/288 |
| 4,777,578 | 10/1988 | Jahns | 363/98 |
| 4,906,915 | 3/1990 | Abdi | 323/316 |
| 5,008,586 | 4/1991 | Miyazaki et al. | 323/315 |
| 5,032,745 | 7/1991 | Izadinia et al. | 307/571 |

FOREIGN PATENT DOCUMENTS

| | | | |
|---|---|---|---|
| 107074 | 6/1983 | Japan | 363/56 |
| 2162390 | 4/1985 | United Kingdom . | |

OTHER PUBLICATIONS

Nathan Zommer & Joseph Biran, IXYS Corporation, "Power Current Mirror Devices and their Applications", Sep. 1986, PCIM, pp. 14, 18 and 20.

IXYS/Samsung Joint Venture: Automotive Hi-Side Driver: file: Hi-Drv. SPC Nov. 25, 1987, p. 1.

Motorola Semiconductor Technical Data, "Product Review, SMARTpower High Side Logic-to-Power Switch", Motorola Inc., 1986, p. NP198.

IEEE Power Electronics Specialists Conference, (PESC) '88 Record, vol. 2, Apr. 11, 1988, Kyoto JP pp.

(List continued on next page.)

Primary Examiner—William H. Beha, Jr.
Attorney, Agent, or Firm—Ronald G. Cummings

[57] ABSTRACT

A power delivery circuit for supplying load current to a load includes a current switch connected on the high potential side of a load. In order to detect a current condition, such as an over-current condition in the load, a current sensing and detection circuit preferably cooperates with the current switch wherein such switch comprises a multicellular device with a plurality of terminals. Such terminals include a first main current terminal connected to a source of high potential, a second main current terminal connecting a majority of device cells to the load, a first auxiliary terminal connected at one end to a minority of device cells so as to provide a current generally proportional to the main device current, and a second auxiliary terminal connected at one end to a majority of device cells. The current detection circuit preferably comprises one branch connected between the first auxiliary terminal and ground and including, in serial circuit, a current-to-voltage converting resistor providing a voltage at one end approximately proportional to the main device current and a bias signal-controlled transimpedance device, and another branch connected between the second auxiliary terminal and ground and providing a bias signal for the transimpedance device in the first branch.

48 Claims, 4 Drawing Sheets

OTHER PUBLICATIONS 1319-1324; Jeffery G. Mansmann et al: "ASIC like HVIC for interfacing to half-bridge based power circuits".

Electro/86 and Mini/Micro Northeast Conference Record, vol. 11, 1986, Los Angles US, pp. 1-4 Donald L. Zaremba, Jr.: "How current sense technology improves Power MOSFET switching applications".

Electro/87 and Mini/Micro Northeast Conference Record, vol. 12, 1987, Los Angeles US, pp. 1-8; Artusi et al: "New smartpower devices ease the interfacing to power loads".

*Integrated Circuit Engineering, Design, Fabrication and Applications,* Glaser and Subak-Sharpe, pp. 503-515.

*Bipolar and MOS Analog Integrated Circuit Design,* A. B. Grebene, pp. 169-187.

*VLSI Handbook,* Joseph Di Giacomo, pp. 29.14-29.15.

*Electronic Devices and Circuits,* Third Edition, D. A. Bell, pp. 398-399, pp. 531, 537-538.

*Integrated Circuits and Semiconductor Devices: Theory and Application,* Second Edition, Deboo and Burrous, pp. 23, 91-92.

*Modern MOS Technology: Process, Devices and Design,* DeWitt G. Ong, pp. 230-231.

*Microelectronics,* Second Edition, Millman and Grabel, pp. 123-402.

*Electronic Devices and Circuit Theory* Third Edition, Boylestad and Nashelsky, pp. 507-509.

*Electronic Integrated Systems Design,* Hans R. Camenzind, Microelectronics Series, pp. 236-244.

Electronic Circuits Digital and Analog, Charles A. Holt, p. 483.

*Analysis and Design of Integrated Electronic Circuits,* Paul M. Chirlian, pp. 132-134.

*The Art of Electronics*—Second Edition, Paul Horowitz and Winfield Hill—pp. 89-91—Cambridge University Press—1989.

*Microelectronic Circuits*—Adel S. Sedra and Kenneth C. Smith—pp. 433-436 Holt, Rinehart and Winston.

POWER DELIVERY CIRCUIT WITH CURRENT DETECTION

CROSS-REFERENCE TO RELATED APPLICATION

This application is a continuation of U.S. Ser. No. 07/376,466 filed Jul. 5, 1989, now abandoned, which is a continuation-in-part to U.S. Ser. No. 07/349,022 filed May 9, 1989, abandoned.

BACKGROUND ART

The present invention relates to power delivery circuit for supplying load current to a load, and more particularly to such a circuit including means to detect a condition of the current, such as an over-current condition.

Power delivery circuits first for supplying load current to a load and including over-current detection means are known. See for example, U.S. Pat. Nos. 4,705,997 and 4,654,568. Such circuits typically include a current switch between a load and ground so that the switch is placed on the low potential side of the load. An over-current detection means is then responsive to the current level in the low potential side switch. Such circuits typically require a dual-polarity voltage supply to provide a negative bias to an over-current detection device typically incorporating operational amplifier circuitry.

In environments where only single-polarity voltage supplies are provided, such as in automobiles, the above-described prior art circuitry requiring dual-polarity voltage supply cannot be used. It is also known to use current-sensing MOSFETs in the high side of a power switch. However, these devices employ very complex control circuitry.

It is, accordingly, an object of the invention to provide a power delivery circuit having a switch located on a high potential side of the load and including simple and reliable circuit means to sense a current condition, such as an over-current condition in the load. The power delivery circuit may include means to turn off the current through the switch upon detection of an over-current condition to prevent destruction of the switch or of the load. The foregoing type of circuit is particularly suitable for use with a single-polarity voltage supply, such as typically provided in automobiles. Another object of the invention is the provision of simple and reliable circuit means to sense the condition of current through a current switch to a load and which functions accurately within a relatively narrow tolerance range and over a relatively broad operating range.

A further object of the invention is to provide a power delivery circuit with over-current protection that functions accurately and reliably despite large changes in ambient temperature, such as is typically encountered in an automobile.

Another object of the invention is to provide a power delivery circuit with over-current protection that can be inexpensively manufactured with the use of readily-available discrete components.

In accordance with a preferred form of the invention, the power delivery circuit for supplying load current to a load is provided. The circuit includes a power node for connection to a source of electrical power, a load node for connection to a load, and a high potential current path for supplying electrical current from the power node to the load node. The high potential current path includes a current switch whose switching state is controlled by a control signal on an associated control terminal. The power delivery circuit further includes current sensing circuitry for reliably sensing the level of load current over a wide operating range. The power delivery circuit may further include a single, highly reliable over-current detection circuit responsive to the sensed condition of current in the high potential current path. The over-current detection circuit is for detecting when the current in the high potential current path exceeds a predetermined level. The power delivery circuit, preferably, further includes current turn-off means for disabling current flow to the load when an over-current condition is detected.

In a particularly preferred embodiment of the invention for providing accurate and reliable over-current detection, the current switch in the high potential current path comprises a multicellular device with a plurality of terminals including a first main current terminal connected to the power means, a second main current terminal connecting a majority of device cells to the electrical load, a first auxiliary terminal connected at one end to a minority of device cells so as to provide a current generally proportional to the main device current, and a second auxiliary terminal connected at one end to the majority of device cells. The over-current detection circuit in this embodiment preferably comprises one branch connected between the first auxiliary terminal and a reference potential such as ground and including, in serial circuit, a bias-controlled transimpedance device such as a transistor and a resistor placed between the transimpedance device and the ground and providing a voltage at one end approximately proportional to the main device current, and another branch connected between the second auxiliary terminal and the ground and providing a control signal for the transimpedance device in the first branch.

The transimpedance device in the foregoing over-current detection circuit beneficially couples the current from the high-potential-side first auxiliary node to the resistor that is at low potential. This permits such resistor to be selected so as to provide a desired sense voltage indicative of a particular load current. Moreover, the branch connected between the second auxiliary terminal and the ground for providing the control signal preferably includes a transistor having its base cross-connected to the transimpedance device in the first branch and further having its base shorted to its collector.

BRIEF DESCRIPTION OF THE DRAWINGS

The above objects as well as other objects of this invention shall become readily apparent after reading the following description of the accompanying drawings, in which.

BEST MODE(S) FOR CARRYING OUT THE INVENTION

Figure 1:
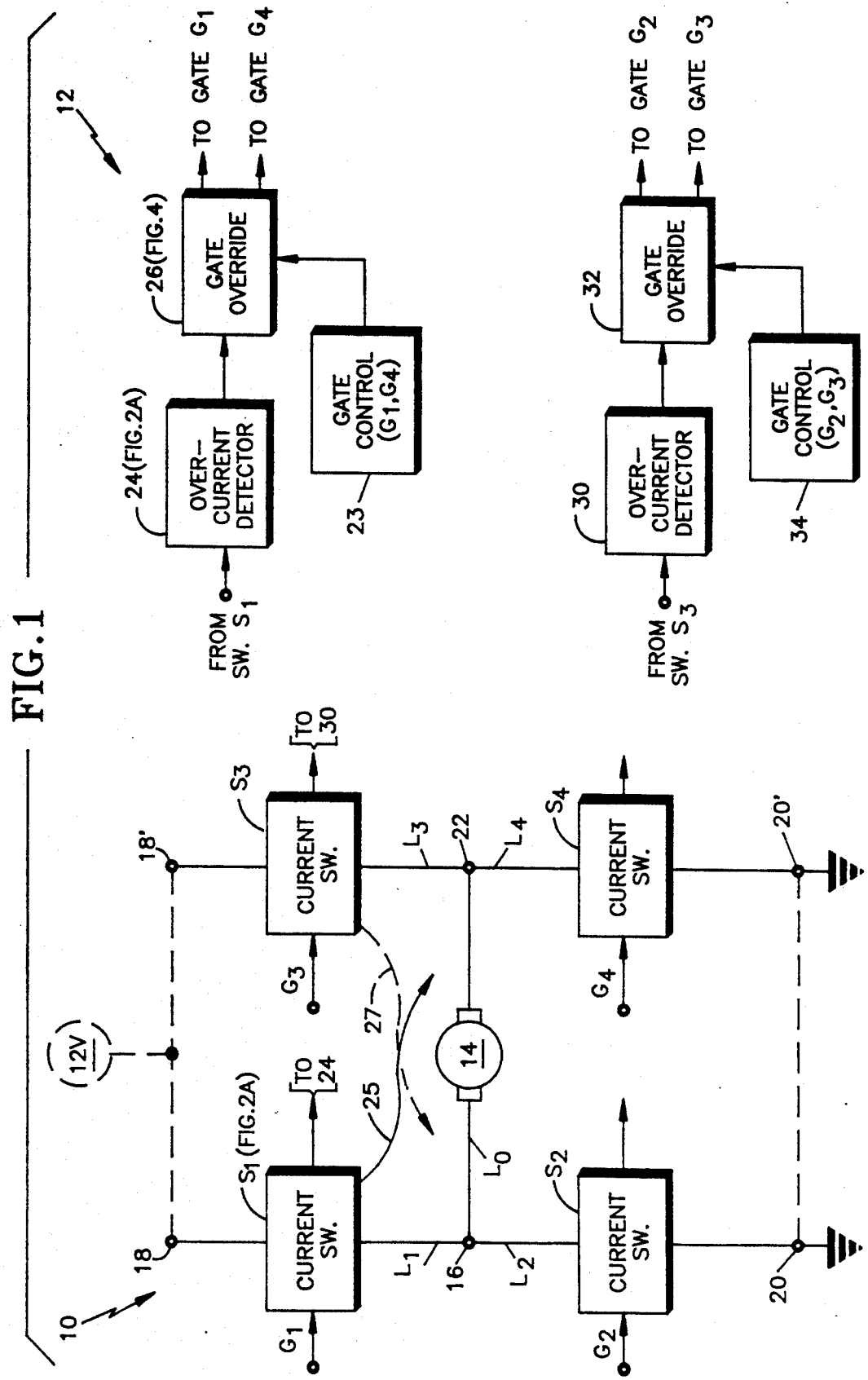
FIG. 1 is a schematic illustration partially in block diagram form providing an overview of the present invention as used in a so-called "H"-bridge circuit.

In the drawings, like reference numerals refer to like parts unless otherwise noted.

FIG. 1 shows a general overview of the power delivery circuit, and the current detection circuit of the invention as used in conjunction with an exemplary H-bridge circuit 10. The power delivery circuit of FIG. 1 additionally includes control circuitry 12 associated with H-bridge circuit 10.

Considering first H-bridge circuit 10, a load leg $L_0$ extends horizontally and contains a load 14, such as an electrical motor. Vertical leg $L_1$ extends between left end node 16 of load leg $L_0$ and an upper node 18, which typically is at a nominal 12-volt potential for automotive applications. Load leg $L_2$ extends between node 16 and a node 20, typically at ground reference potential. Connected between a right end node 22 of load leg $L_0$ and an upper node 18' is load leg $L_3$. Load leg $L_4$ is connected between end node 22 and ground node 20'.

The reference to "vertical" and "horizontal" orientations of the various legs of H-bridge circuit 10 are, of course, merely for descriptive purposes and may or may not accurately describe the layout of an actual H-bridge circuit.

As indicated by the phantom lines high potential nodes 18 and 18' are typically interconnected, and ground nodes 20 and 20' similarly are also interconnected.

Contained within load legs $L_1$ to $L_4$, respectively, are current switches $S_1$ to $S_4$, respectively. These switches are controlled by respective signals on their gates $G_1$ to $G_4$. As used herein, the term "gate" broadly encompasses any form of control lead for changing the switching state of a current switch. As such, the term "gate" is intended to be synonymous with the "base" of a bipolar transistor, for example.

In order to direct current through load 14 in the direction shown by a curved arrow 25, appropriate signals are placed on gates $G_1$ and $G_4$ of switches $S_1$ and $S_4$, respectively, to turn such switches on, while appropriate signals are placed on the gates $G_2$ and $G_3$ of switches $S_2$ and $S_3$, respectively, to keep these switches off during this time. Conversely, to direct current through load 14 in the direction shown by curved arrow 27, switches $S_2$ and $S_3$ are made to conduct by appropriate control of their gates, while the other switches $S_1$ and $S_4$ are kept off during this time.

In order to prevent an over-current condition from destroying the load 14 or the switches $S_1$ and $S_3$ located in the high potential legs of H-bridge circuit 10 ("high side switches"), over-current detectors 24 and 30, shown as part of control circuitry 12, respond to electrical conditions in high potential legs $L_1$ and $L_3$, respectively. In a preferred arrangement, over-current detector 24 is responsive to electrical conditions within switch $S_1$, described below in connection with FIGS. 2A and 3.

Figure 2A:
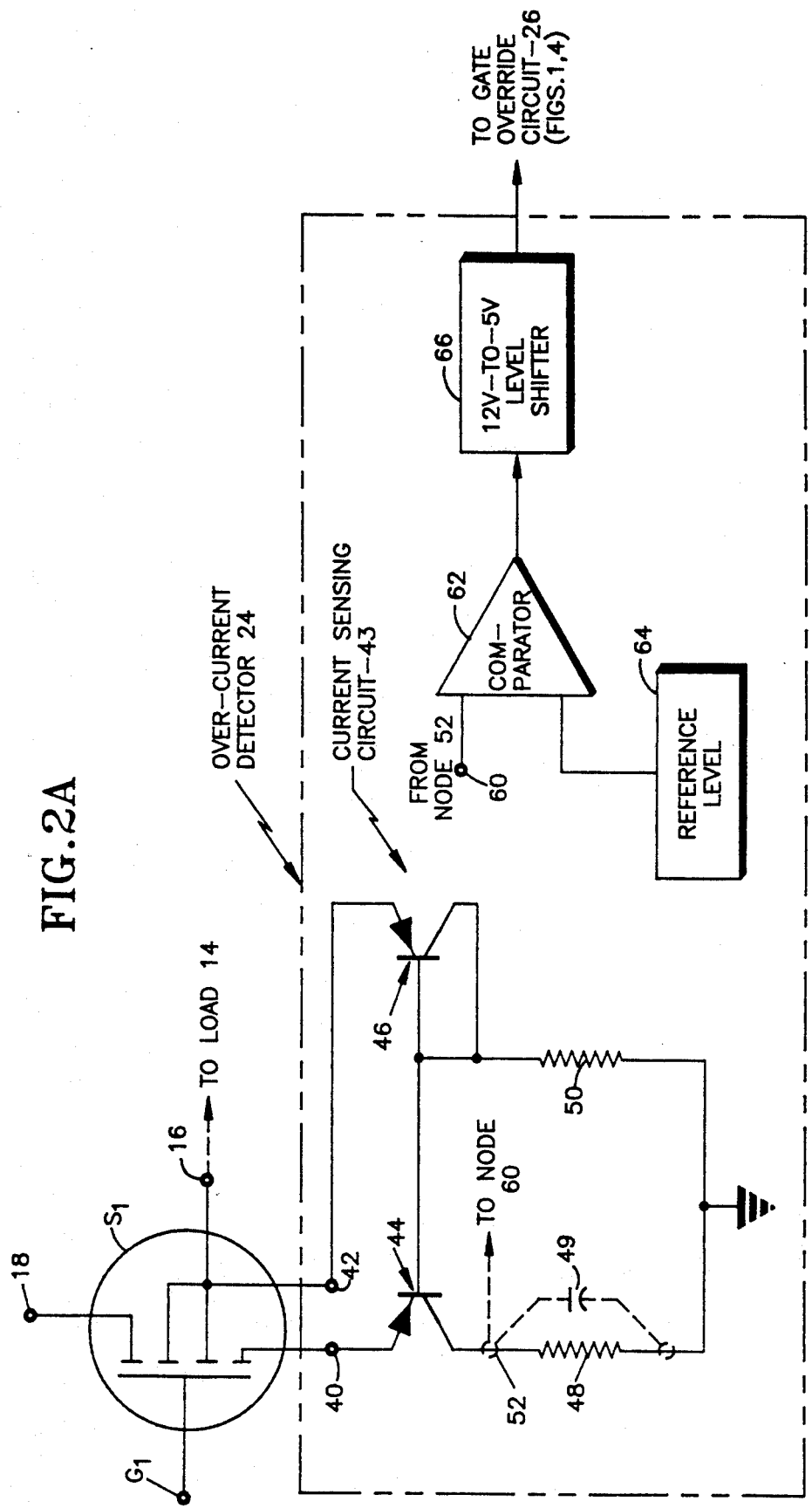
FIG. 2A is a schematic circuit diagram partially in block form of current switch $S_1$ and over-current detector 24 of FIG. 1.

Continuing with FIG. 1, if an over-current condition is detected by detector 24, a gate override circuit 26 overrides a conventional gate control function 23 to assure that switches $S_1$ and $S_4$ remain off. Similarly, upon detection of an over-current condition in switch $S_3$ by detector 30, a gate override circuit 32 prevents conventional gate control function 34 from turning on switches $S_2$ and $S_3$ Switch $S_1$ and over-current detector 24 are described in greater detail in FIG. 2A. Switch $S_3$ and over-current detector 30 are suitably of corresponding construction to switch $S_1$ and detector 24. Turning to FIG. 2A, switch $S_1$ is represented by a symbol for a MOSFET device, such as that sold by International Rectifier under the trademark "HEXSense". The main load terminals of HEXSense device $S_1$ are illustrated as terminals 16 and 18. Terminal 16 is the main source terminal of switch $S_1$, and terminal 18 is the sole drain terminal of the switch. Gate $G_1$ corresponds to gate $G_1$ of current switch $S_1$ of FIG. 1.

Figure 3:
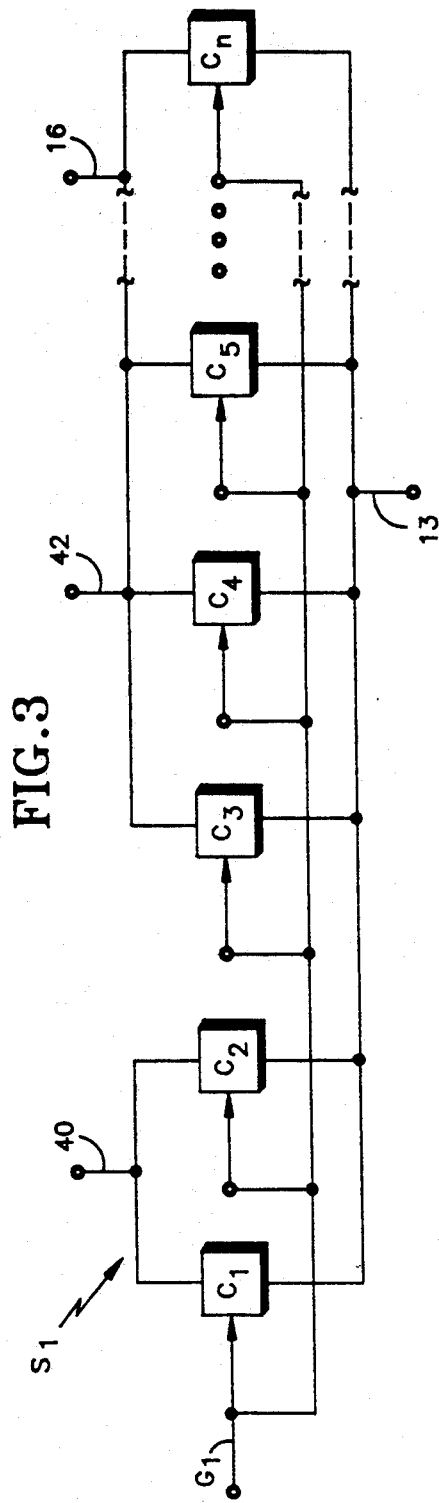
FIG. 3 is a simplified schematic of a multicellular current switch preferably used to implement switch $S_1$ in FIG. 1.

HEXSense device $S_1$ includes two auxiliary, further terminals 40 and 42. The interrelation of auxiliary terminals 40 and 42 to the main terminals 16 and 18 of switch $S_1$ is explained in connection with the schematic representation of switch $S_1$ in FIG. 3. Cells $C_1$ through $C_n$ shown in FIG. 3, represent individual cells of HEXSense device $S_1$. Common gate $G_1$ provides a common gate signal for the individual gates of cells $C_1$-$C_n$. Drain electrode 18 serves as a common drain electrode for all the cells $C_1$-$C_n$. Source terminal 16 serves as a common source for a majority of the cells of switch $S_1$, namely cells $C_3$-$C_n$, while terminal 42 serves as an auxiliary source electrode connected in common with source electrode 16 except for minor metalization resistance (not shown). Auxiliary terminal 40 serves as a source electrode for only a minority of the cells of switch $S_1$, namely cells $C_1$-$C_2$. In an actual device having several thousands or more cells, the auxiliary terminal 40 could serve as a source for perhaps several hundreds of cells.

HEXSense device $S_1$ is formed as one integrated circuit with each of its cells having similar characteristics to its other cells. For this reasons, a current which flows from drain 18 to auxiliary source 40 is approximately proportional to the current that flows from drain 18 to main source 16, where such proportion is determined by the ratio of the minority number of cells connected to terminal 49 to the majority number of cells connected to terminal 16.

Further details of HEXSense device $S_1$ are contained in Power MOSFET Application Notes, No. AN-959, published by International Rectifier in 1986, and incorporated herein by reference.

In view of the above description of the multicellular construction, it will be apparent to those skilled in the art that other types of multicellular switching devices could be used herein instead of a HEXSense device. By way of example, a multicellular thyristor device would comprise a suitable replacement.

Returning to FIG. 2A, auxiliary terminals 40 and 42 are shown connected to a current-sensing circuit 43 having two branches and comprising PNP bipolar transistors 44 and 46 and resistors 48 and 50. Current from $S_1$ that flows through auxiliary terminal 40 is conducted in one branch through a bias-signal controlled transistor 44 to cause a voltage drop across resistor 48. Transistor 44 and resistor 48 are series connected in the one branch, with the transistor connected to auxiliary terminal 40 and the resistor having one end connected to ground in the illustrated embodiment. Neglecting the bias signal, or base current, in transistor 44, the voltage drop across resistor 48 is proportional to the current flowing through terminal 40 and, hence, to the load current flowing through terminal 16. The voltage at node 52 is thus proportional to the load current. Transistor 44 functions as a transimpedance device to couple the current from the high potential side auxiliary node 40 to the low potential side resistor 48. This permits resistor 48 to be selected so as to provide a desired sense voltage indicative of a particular load current.

In the other branch, transistor 46 of circuit 43, having a short across its base and collector so as to function as a P-N diode, provides a bias signal (base current here) for transistor 44. Transistor 46 and resistor 50 are series connected in that other branch, with the transistor connected to auxiliary terminal 42 and the resistor connected between the transistor's collector and ground.

For optimized performance, it is preferred that the transistors 44 and 46 be formed of matched silicon and that the base currents of those transistors be substantially the same. In this manner, the voltage drops across the emitter-base junctions of transistors 44 and 46 are nearly equal. Thus, the sensing circuit 43 forms an impedance matching buffer and will maintain the same voltage at terminal 40 as the voltage at terminal 42. It should be appreciated that this is a critical requirement to maintain the current ratio accuracy of the HEXSense device. Small deviations in the voltage between terminals 40 and 42 create large errors in the current ratio of the HEXSense device.

Resistors 48 and 50 of the current-sensing circuit 43 are preferably, but not necessarily, selected to result in equal currents through them when an over-current condition occurs in the load. Resistors 48 and 50 may be selected so that the voltage at node 52 varies somewhat linearly with the load current about a particular value of load current according t the ratio of the number of cells in HEXSense switch S₁ connected to auxiliary terminal 40 to the number of cells in such switch connected to load 14. A circuit designer can, however, select resistors 48 and 50 so that the voltage at node 52 varies as above with load current but according to a ratio differing from the foregoing ratio. Thus, a circuit designer can select resistors 48 and 50 to alter the relative change of voltage at node 52 to the change of level of current in load 14.

Where the line voltage on node 18 (FIG. 2A) is nominally 12 volts, PNP transistor 44 and 46 typically each have a beta value of 200 and a breakdown voltage of 60 volts, and resistors 48 and 50 typically have values of 487 and 9.1K ohms, respectively. Additionally, a 0.001 or 0.01 microfarad capacitor 49 (shown in phantom) is preferably placed across resistor 48 to filter any potential current spikes during turn-on.

The above-described arrangement of current-sensing circuit 43 is relatively accurate and stable, being well-suited to provide a voltage at node 52 which is proportional, within a tolerance of about ±3%, to the actual current through the associated current switch (and load) in the region of a particular value of load current across a relatively broad range of operating characteristics, as often encountered in, for example, an automotive environment. That operating range across which this circuit configuration is accurate to within ±3% includes variations of ±25% in the supply potential from the nominal 12 volts, variations in the gains (B) of transistors 44 and 46 in the range of 100 to 500, or more and/or variations in temperature of ±60° C. from an ambient of about 25° C. Such variations in the supply potential are occasioned by inductive loading on the battery supply and/or dissipation via age and/or loading. Variations in the transistor gains ($\beta$) occur through initial mismatch and particularly as operating temperatures change, with lower gains (i.e., 100 or less) being at relatively cold ambient temperatures and the higher gains (i.e., 500 or more) being at hot operating temperatures.

The voltage on node 52 of current-sensing circuit 43 may serve as an input to a variety of "use" devices, and in the described embodiment it is applied to input node 60 of a comparator 62, whose other input is a reference voltage level 64 selected to determine the over-current level. The output of comparator 62 is then processed by a 12-volt-to-5-volt level shifter 66 so that further processing can conveniently occur with standard 5-volt logic circuitry. When the voltage at node 60 exceeds that of reference level voltage 64, the comparator 62 provides an output, processed by voltage level shifter 66, which is applied to gate override circuit 26 described in connection with FIGS. 1 and 4.

Current-sensing circuit 43 can be replaced by other circuits that provide a voltage at node 60 of comparator 62 that is approximately proportional to load current, with possibly greater or lesser accuracy and greater or lesser cost.

Figure 2B:
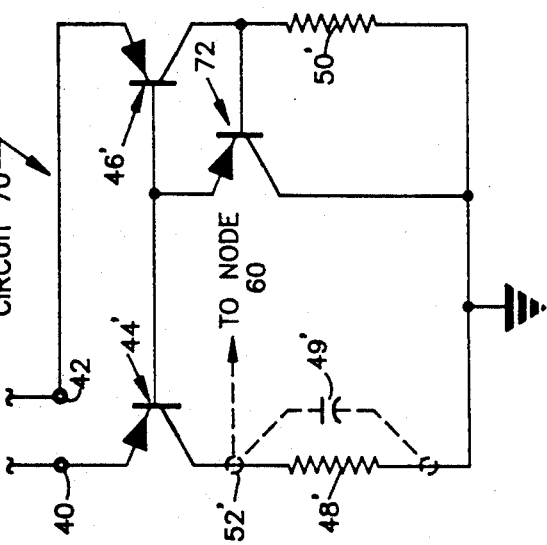
FIG. 2B is a schematic illustration of an alternative current-sensing circuit that can be used in the over-current detector of FIG. 2A.

An alternative current-sensing circuit is illustrated for best mode purposes in FIG. 2B as circuit 70. Like circuit 43 of FIG. 2A, circuit 70 of FIG. 2B preferably includes two PNP bipolar transistors 44' and 46' and resistors 48' and 50'. Transistor 44' and resistor 48' of circuit 70 function in the same manner as the like-numbered elements of circuit 43 of FIG. 2A. An additional PNP bipolar transistor 72, however, is provided in association with transistor 46'. The addition of transistor 72 provides a measure of gain stabilization which causes circuit 70 to operate slightly more consistently for variations in ambient temperature and supply voltage.

With the possible exception of matched-silicon transistors 44 and 46, both current-sensing circuits 43 and 70 (FIG. 2A and 2B) may be advantageously formed by inexpensive, discrete elements.

In current-sensing circuit 70, PNP transistors 44', 46' and 72 preferably each have a typical beta value of 200 and a typical breakdown voltage of 60 volts, and resistors 48' and 50' preferably have values of 240 and 6.5K ohms, respectively. Additionally, a shunting capacitor 49' (shown in phantom) across resistor 48' is preferably used to filter any potential current spikes during turn-on. Typical values are 0.001 or 0.01 microfarads.

Figure 4:
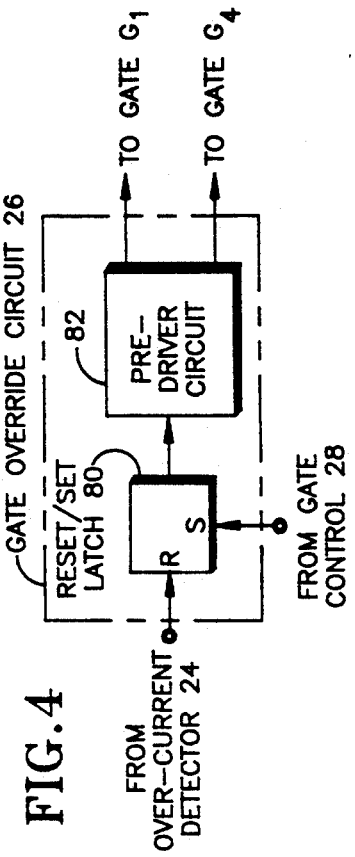
FIG. 4 is a block diagram of sub-circuits contained within gate override circuit 26 of FIG. 1.

In FIG. 4, gate override circuit 26, described above in connection with FIG. 1, is shown in more detail. Considering FIG. 4, an over-current signal from over-current detector 24, typically at a 5-volt level, may be provided to the reset terminal of a reset/set latch 80, which may be conventionally formed by two CMOS NAND gates (not shown). A signal applied to the reset terminal of latch 80 will override any signal from gate control function 28 which is supplied to the set input of the reset/set latch 80 and which typically is a 5-volt signal from a microprocessor. The output of the reset/set latch 80 is then processed by a pre-driver circuit 82 to provide appropriate biasing signals for gates G₁ and G₄ of switches S₁ and S₄ (FIG. 1), respectively.

The high potential side gates G₁ and G₃ are preferably provided with a biasing voltage of about 12 volts above the supply voltage, which may be generated with a conventional voltage-doubling circuit (not shown). This is in contrast to the low potential side gates G₂ and G₄ which are preferably provided with a biasing voltage at the supply voltage level, typically 12 volts. Pre-driver circuit 82 cooperates with a counterpart pre-driver circuit (not shown) of gate override circuit 32 (FIG. 1) to provide the foregoing biasing voltages. The foregoing pre-driver circuits can be designed as illustrated to have one logic input from latch 80 control switches $S_2$ and $S_3$ and the other logic input (not shown) control the other two switches. Alternatively, the pre-driver circuits can be designed to have one logic input toggle switches $S_1$, $S_2$, or vice-versa; and to have the other logic input likewise toggle the other switches.

Pre-driver circuit 82 and its counterpart (not shown) for switches $S_2$ and $S_3$ can, further, be designed to provide delay times to the control signals on gates $G_1$–$G_4$ to insure that current is fully off in one direction through the load before causing current flow in the other direction. Alternatively, gate control functions 28 and 34 (FIG. 1), typically implemented by a microprocessor, may provide such delay times.

Figure 5:
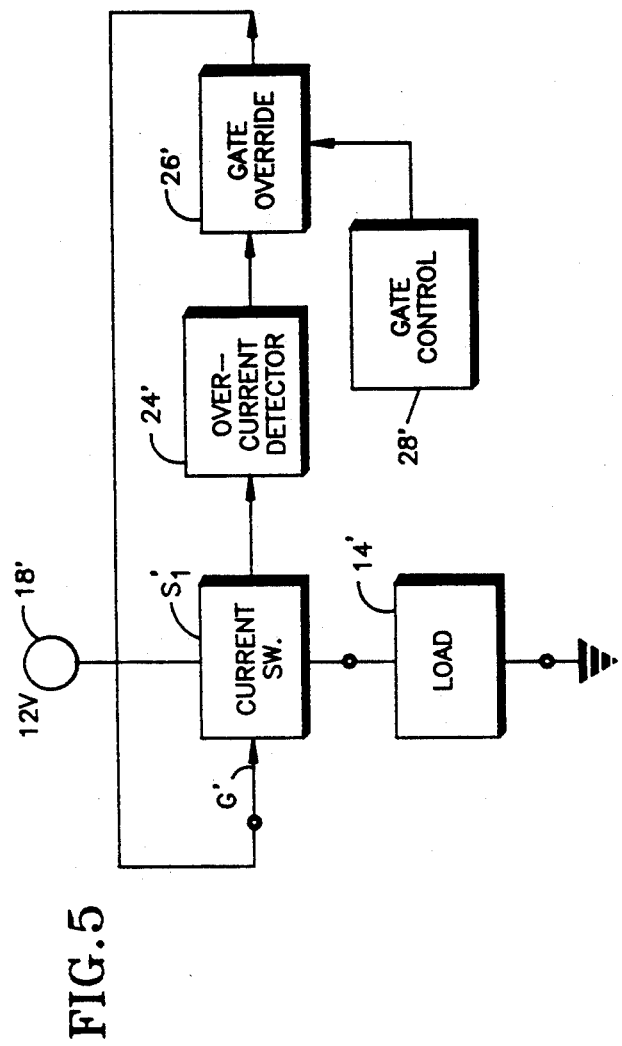
FIG. 5 is a schematic illustration partially in block form of a generalized form of the invention.

FIG. 5 shows a more generalized form of the invention in which a single current switch $S_1'$ is placed on the high potential side of a load 14'. The over-current detector 24', gate override circuit 26', and gate control function 28' correspond to the like-numbered parts shown in connection with the above-described power delivery circuit of the H-bridge type.

The foregoing describes a power delivery circuit for supplying load current to a load. The power delivery circuit includes an over-current detection circuit for detecting an over-current condition in the load. Also described are novel current-sensing circuits. The power delivery circuit of the invention may comprise the form of an H-bridge circuit for supplying current of selectable polarity to a load. The power delivery circuit of the invention can employ inexpensive and readily-available discrete components.

Although the present invention has been described in connection with a preferred embodiment thereof, many other variations and modifications will now become apparent to those skilled in the art. It is preferred, therefore, that the present invention be limited not by the specific disclosure herein, but only by the appended claims.

I claim:

1. A current detection circuit in combination with a current controlling device in a power delivery circuit for supplying load current to a load, the current controlling device being multicellular, with a major current-carrying cellular portion and a minor current-carrying cellular portion, a first main current terminal for connection to a source of power, a gate terminal for receiving a control signal, a second main current terminal connecting the major current-carrying cellular portion, a first auxiliary terminal connected at one end to the minor current-carrying cellular portion so as to provide a current generally proportional to the main device current, and a second auxiliary terminal connected at one end to the major current-carrying cellular portion, and wherein the current detection circuit comprises:

first and second branches each for connection at one end to a respective one of said first and said second auxiliary terminals and having means for connection in common at the other end to a reference potential in the power delivery circuit;

said first branch including a first series-connected semiconductor device;

said first branch including a second series-connected semiconductor device;

said first semiconductor device operating in a transimpedance mode and being controlled by a bias signal;

said second semiconductor device being cross-connected with said first semiconductor device to provide the respective said bias signal thereto;

a first node providing a signal approximately proportional to the main device current; and wherein said second semiconductor is connected in said second branch in a manner providing a bias signal for controlling said first semiconductor so as to result in said signal at said node being proportional to the main device current within a relatively small tolerance range across a relatively broad operating range.

2. The combination of claim 1 wherein said power delivery circuit is connectable to a power supply having a predetermined nominal voltage;

said relatively small tolerance range is within about ±3% of the actual main device current; and said relatively broad operating range includes variations in the supply voltage of at least ±25% of said nominal supply voltage, variations between 100 and 500 in the gains ($\beta$) of said first and second semiconductors and variations in temperature of ±60° C. from an ambient of about 25° C.

3. The combination of claim 2 wherein said first and second semiconductors are first and second bipolar transistors respectively and being cross-connected by having their bases connected in common.

4. The combination of claim 3 wherein said first and said second bipolar transistors are PNP transistors.

5. The combination of claim 3 wherein said first and said second bipolar transistors are formed of matched silicon.

6. The combination of claim 3 wherein the base and the collector of said second bipolar transistor are shorted to one another.

7. The combination of claim 6 wherein said second branch further includes impedance means connected in series circuit with said second semiconductor.

8. The combination of claim 1 further comprising current turn-off means for turning off the current controlling device via the gate terminal when the current detection circuit detects load current in excess of a predetermined level.

9. The combination of claim 1 wherein said signal at said first node is a voltage signal.

10. The combination of claim 1 wherein said signal at said first node is a current signal.

11. The combination of claim 1 comprising impedance means for providing a voltage signal proportional to the main device current at said first node.

12. The combination of claim 11 wherein said impedance means comprises a resistor.

13. A current detection circuit for use in combination with a current controlling device in a power delivery circuit for supplying load current to a load, the current controlling device being multicellular, with a major current-carrying cellular portion and a minor current-carrying cellular portion, a first main current terminal for connection to a source of power, a gate terminal for receiving a control signal, a second main current terminal connecting the major current-carrying cellular portion, a first auxiliary terminal connected at one end to the minor current-carrying cellular portion so as to provide a current generally proportional to the main device current, and a second auxiliary terminal connected at one end to the major current-carrying cellular portion, the current detection circuit comprising:

first and second branches each for connection at one end to a respective one of said first and said second auxiliary terminals and having means for connection in common at the other end to a reference potential in the power delivery circuit;

said first branch including a first bipolar transistor with its emitter and collector connected in series therein;

said second branch including a second bipolar transistor with its emitter and collector connected in series therein;

said first bipolar transistor operating in a transimpedance mode and being controlled by a bias signal;

said second bipolar transistor having its base shorted to its collector and cross-connected to the base of said first bipolar transistor to provide the respective said bias signal thereto; and said first branch further including impedance means connected in series circuit with said first bipolar transistor for providing a voltage approximately proportional to the main device current at a node at one end of said impedance means.

14. The current detection circuit of claim 13, wherein said power delivery circuit in which said current detection circuit is for use is connectable to a power supply having a predetermined nominal voltage;

said voltage at said node being proportional to the main device current within about ±3% of the actual main device current for an operating range including variations with supply voltage of ±25% of said nominal supply voltage and variations between 100 and 500 in the gains ($\beta$) of said first and second bipolar transistors.

15. The current detection circuit of claim 14 wherein said second branch further includes an other impedance means, said other impedance means being connected between the collector of said second bipolar transistor and said reference potential.

16. A power delivery circuit of the H-bridge type including:

a load leg having two end nodes and means to connect to a load;

a power means for connection to a source of electrical power having a predetermined nominal voltage for supplying current to the load;

a ground means for providing a path for returning load current to the source of electrical power;

a first current path for supplying load current through the load in a first direction comprising a first high potential leg connected between the power means and a first end node of the load leg, and a first low potential leg connected between a second end node of the load leg and the ground means; and a second current path for supplying load current through the load in a second direction comprising a second high potential leg connected between the power means and the second end node of the load leg, and a second low potential leg connected between the first end node of the load leg and the ground means;

the high and low potential legs each including a respective current switch, each said high potential leg current switch being multicellular with a plurality of terminals, including a first main current terminal connected to the power means, a second main current terminal connecting a majority of device cells to a respective end node of the load leg, a control terminal for controlling the switching state of the switch in response to a control signal, a first auxiliary terminal connected to one end of a minority of switch cells so as to provide a current generally proportional to the main switch current, and a second auxiliary terminal connected at one end to the majority of switch cells;

the power delivery circuit further comprising first and second current detection circuits responsive to electrical conditions in the first and second high potential legs, respectively, for detecting the current level in either of such legs;

each current detection circuit comprising a first branch connected between the first auxiliary terminal and the ground means and including in serial circuit, a resistor providing a voltage at one end approximately proportional to the main switch current and a bias signal-controlled first bipolar transistor, and a second branch connected between the second auxiliary terminal and the ground means and including in serial circuit, a second bipolar transistor, the base of the second transistor being shorted to its collector and being connected to the base of the first transistor for providing a bias signal for the first transistor in the first branch whereby said voltage at said resistor one end is proportional to the actual main switch current within ±3% for variations in the source voltage in a range of at least ±25% of said nominal source voltage and variations between 100 and 500 in the gains ($\beta$) of said first and second transistors.

17. The power delivery circuit of claim 16 wherein said first and said second bipolar transistors are formed of matched silicon.

18. The power delivery circuit of claim 16 wherein said second branch further includes a resistor connected between the collector of said second bipolar transistor and said ground means.

19. The power delivery circuit of claim 16 further comprising current turn-off means for turning off at least the current switch in the first or second high potential leg when the respective, associated current detection circuit detects current in excess of a predetermined level in such high potential leg.

20. A power delivery circuit for supplying load current to a load comprising:

(a) a power node for connection to a source of electrical power;

(b) a load node for connection to a load;

(c) a high potential current path for supplying electrical current from the power node to the load node and including a current switch whose switching state is controlled by a control signal on an associated control terminal; said current switching having first and second main terminals, a first auxiliary terminal which produces a current which is a predetermined fraction of the total current in the high potential current path, and a second auxiliary terminal connected to one of the main terminals of the current switch;

(d) a current detection circuit responsive to an electrical condition of the high potential current path and being for detecting the current level in the high potential current path; the current detection circuit comprising:

(1) a first branch connected to one of said first and second auxiliary terminals and comprising a first semiconductor device;

(2) a second branch connected to the other of said first and second auxiliary terminals and comprising a second semiconductor device;

(3) said second semiconductor device being interconnected to said first semiconductor device in a current mirror configuration so as to maintain said first and second auxiliary terminals at substantially the same voltage; and (4) a first node providing a signal approximately proportional to load current.

21. The circuit of claim 20 wherein said first and second semiconductor devices are first and second bipolar transistors respectively with commonly connected base electrodes and the base electrode of said second transistor interconnected to the collector electrode of said second transistor in a current mirror configuration.

22. The circuit of claim 21 wherein said base electrode of said second transistor is shorted to the collector electrode of said second transistor.

23. The circuit of claim 21 wherein said first and second transistors are formed of matched silicon.

24. The circuit of claim 21 wherein the emitter electrode of said first transistor is connected to the first auxiliary terminal and the emitter electrode of said second transistor is connected to the second auxiliary terminal.

25. The circuit of claim 20 wherein said signal at said first node is a voltage signal.

26. The circuit of claim 20 wherein said signal at said first node is a current signal.

27. The circuit of claim 20 comprising impedance means for providing a voltage signal proportional to the main device current at said first node.

28. The circuit of claim 27 wherein said impedance means comprises a resistor.

29. The circuit of claim 24 wherein said impedance means is interconnected to said first branch.

30. The circuit of claim 29 wherein said impedance means comprises a resistor connected to said first branch.

31. A power delivery circuit for supplying load current to a load, comprising:
a power node for connection to a source of electrical power;
a load node for connection to a load;
a high potential current path for supplying electrical current from the power node to the load node and including a current switch whose switching state is controlled by a control signal on an associated control terminal; said current switch having first and second main terminals, a first auxiliary terminal which produces a current which is a predetermined fraction of the total current in the high potential current path, and a second auxiliary terminal connected to one of the main terminals of the current switch;
a current detection circuit responsive to an electrical condition of the high potential current path and being for detecting the current level in the high potential current path; the current detection circuit comprising one branch connected between one of the first and second auxiliary terminals and a ground and including a bias signal-controlled transimpedance device and another branch connected between the other of the first and second auxiliary terminals and the ground and providing a bias signal for the transimpedance device in the first branch, and a first node providing a signal approximately proportional to the main device current.

32. The power delivery circuit of claim 31, further comprising current turn-off means for turning off the current switch in the high potential current path when the current detection circuit detects current in excess of a predetermined level in the high potential current path.

33. The power delivery circuit of claim 31, wherein the current switch in the high potential current path comprises a multi-cellular device with a plurality of terminals, including said first main current terminal connected to the power means, said second main current terminal connecting a majority of device cells to a respective end node of the load leg, said first auxiliary terminal connected at one end to a minority of device cells so as to provide a current generally proportional to the main device current, and a second auxiliary terminal connected at one end to the majority of device cells; and wherein the current detection circuit is responsive to electrical conditions of the first and second auxiliary terminals.

34. The power delivery circuit of claim 31, which further includes a second transimpedance device in said other branch and coupled between said load node and said ground; said second transimpedance means producing a bias signal which is coupled to said bias signal-controlled transimpedance device.

35. The power delivery circuit of claim 31 wherein said signal at said first node is a voltage signal.

36. The power delivery circuit of claim 31 wherein said signal at said first node is a current signal.

37. The power delivery circuit of claim 31 comprising impedance means for providing a voltage signal proportional to the main device current at said first node.

38. The power delivery circuit of claim 37 wherein said impedance means comprises a resistor.

39. The power delivery circuit of claim 37 wherein said impedance means is connected in serial circuit in said one branch.

40. A power delivery circuit of the H-bridge type including:
a load leg having two end nodes and means to connect to a load;
a power means for connection to a source of electrical power for supplying current to the load; said power means having a first auxiliary terminal and a second auxiliary terminal; said first auxiliary terminal producing current which is a predetermined fraction of the total current through said power means;
a ground means for providing a path for returning load current to the source of electrical power;
a first current path for supplying load current through the load in a first direction comprising a first high potential leg connected between the power means and a first end node of the load leg, and a first low potential leg connected between a second end node of the load leg and the ground means; and
a second current path for supplying load current through the load in a second direction comprising a second high potential leg connected between the power means and the second end node of the load leg, and a second low potential leg connected between the first end node of the load leg and the ground means;

the high and low potential legs each including a respective current switch whose switching state is controlled by a control signal on an associated control terminal;

the power delivery circuit further comprising first and second current detection circuits responsive to electrical conditions in the first and second high potential legs, respectively for detecting the current level in either of such legs;

each current detection circuit comprising one branch connected between one of the first and second auxiliary terminals and the ground means and including a bias signal-controlled transimpedance device and another branch connected between the other of the first and second auxiliary terminals and the ground means and providing a bias signal for the transimpedance device in the first branch and a first node providing a signal approximately proportional to the main device current.

41. The power delivery circuit of claim 40 further comprising current turn-off means for turning off at least the current switch in the first or second high potential leg when the respective, associated current detection circuit detects current in excess of the predetermined level in such high potential leg.

42. The power delivery circuit of claim 40, wherein each current switch in the first and second high potential legs comprises a multi-cellular device with a plurality of terminals, including a first main current terminal connected to a power means, a second main current terminal connecting a majority of device cells to a respective end node of the load leg, said first auxiliary terminal connected at one end to a minority of device cells so as to provide a current generally proportional to the main device current, and said second auxiliary terminal connected at one end to the majority of device cells; and wherein each current detection circuit is responsive to electrical conditions of the first and second auxiliary terminals.

43. The power delivery circuit of claim 40, which further includes a second transimpedance device in said other branch and coupled between said load node and said ground; said second transimpedance means producing a bias signal which is coupled to said bias signal-controlled transimpedance device.

44. The power delivery circuit of claim 40 wherein said signal at said first node is a voltage signal.

45. The power delivery circuit of claim 40 wherein said signal at said first node is a current signal.

46. The power delivery circuit of claim 40 comprising impedance means for providing a voltage signal proportional to the main device current at said first node.

47. The power delivery circuit of claim 46 wherein said impedance means comprises a resistor.

48. The power delivery circuit of claim 11 wherein said impedance means is connected in serial circuit in said one branch.

* * * * *

REEXAMINATION CERTIFICATE (3241st)

United States Patent [19]

Juzswik

[11] B1 5,245,523

[45] Certificate Issued Jun. 24, 1997

[54] POWER DELIVERY CIRCUIT WITH CURRENT DETECTION

[75] Inventor: David L. Juzswik, Dearborn Heights, Mich.

[73] Assignee: United Technologies Automotive, Inc., Dearborn, Mich.

Reexamination Request:
No. 90/003,786, Apr. 10, 1995

Reexamination Certificate for:
Patent No.: 5,245,523
Issued: Sep. 14, 1993
Appl. No.: 746,144
Filed: Aug. 14, 1991

Related U.S. Application Data

[63] Continuation of Ser. No. 376,466, Jul. 5, 1989, abandoned, which is a continuation-in-part of Ser. No. 349,022, May 9, 1989, abandoned.

[51] Int. Cl.$^6$ ................................................. H02H 7/12
[52] U.S. Cl. ............................ 363/56; 318/599; 323/315; 361/31; 361/93; 363/63

[56] References Cited

U.S. PATENT DOCUMENTS

| Re. 30,297 | 6/1980 | Wittlinger | 330/288 |
|---|---|---|---|
| 4,477,737 | 10/1984 | Ulmer et al. | 323/316 |
| 4,533,845 | 8/1985 | Bynum et al. | 307/540 |
| 4,677,323 | 6/1987 | Marsh | 323/315 |

OTHER PUBLICATIONS

H. Camenzind, *Electronic Integrated Systems Design*, pp. 236–237 (Van Nostrand Reinhold Co. 1972).

D. Bell, *Electronic Devices and Circuits*, pp. 398–399 (3d ed. Prentice-Hall 1986).

A. Milnes, *Semiconductor Devices and Integrated Electronics*, pp. 377–381 (Van Nostrand Reinhold Co. 1980).

J. Alberkrack et al., *A New High Performance Current-Mode Controller Teams Up With Current Sensing Power MOSFETs*, Motorola Semiconductor Application Note AN976 (1986).

F. Goodenough, *MOSFET Measures Current With No Loss*, Electronic Design Magazine, pp. 59–60 (Feb. 20, 1986).

J. Millman et al., *Microelectronics*, p. 394 (2d ed. McGraw-Hill 1987).

*Primary Examiner*—Jeffrey Sterrett
*Attorney, Agent, or Firm*—Niro, Scavone, Haller & Niro

[57] ABSTRACT

A power delivery circuit for supplying load current to a load includes a current switch connected on the high potential side of a load. In order to detect a current condition, such as an over-current condition in the load, a current sensing and detection circuit preferably cooperates with the current switch wherein such switch comprises a multicellular device with a plurality of terminals. Such terminals include a first main current terminal connected to a source of high potential, a second main current terminal connecting a majority of device cells to the load, a first auxiliary terminal connected at one end to a minority of device cells so as to provide a current generally proportional to the main device current, and a second auxiliary terminal connected at one end to a majority of device cells. The current detection circuit preferably comprises one branch connected between the first auxiliary terminal and ground and including, in serial circuit, a current-to-voltage converting resistor providing a voltage at one end approximately proportional to the main device current and a bias signal-controlled transimpedance device, and another branch connected between the second auxiliary terminal and ground and providing a bias signal for the transimpedance device in the first branch.

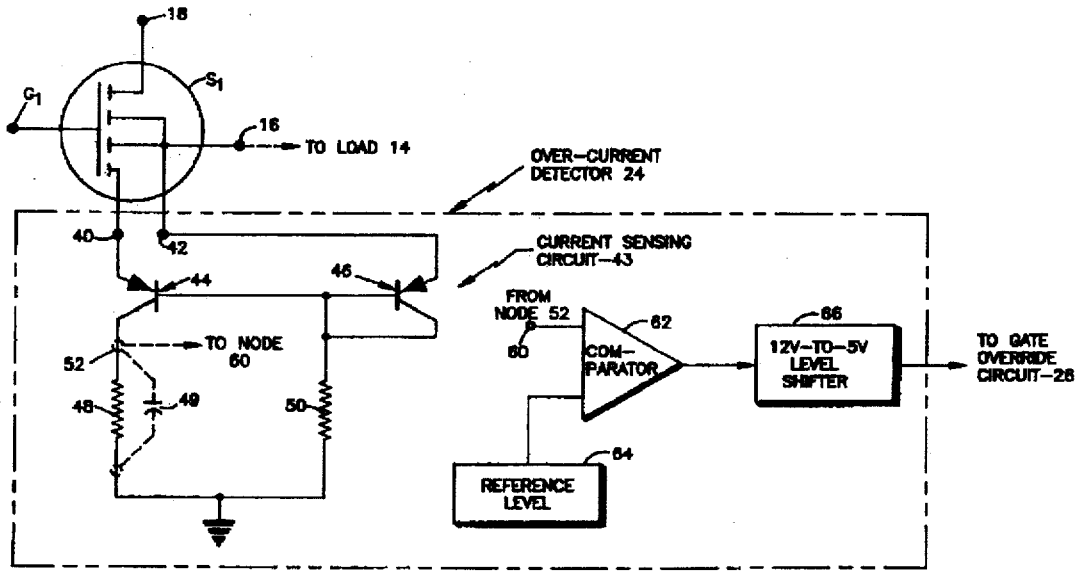

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 16–19 is confirmed.

Claims 1, 13, 20, 31 and 40 are determined to be patentable as amended.

Claims 2–12, 14, 15, 21–30, 32–39 and 41–48, dependent on an amended claim, are determined to be patentable.

1. A current detection circuit in combination with a current controlling device in a power delivery circuit for supplying load current to a load, the current controlling device being multicellular, with a major current-carrying cellular portion *including an output* and a minor current-carrying cellular portion *including an output*, a first main current terminal for connection to a source of power, a gate terminal for receiving a control signal, a second main current terminal connecting the major current-carrying cellular portion, a first auxiliary terminal connected at one end to the *output of the* minor current-carrying cellular portion so as to provide a current generally proportional to the main device current, and a second auxiliary terminal connected at one end to the *output of the* major current-carrying cellular portion, and wherein the current detection circuit comprises:

first and second branches each for connection at one end to a respective one of said first and said second auxiliary terminals and having means for connection in common at the other end to a reference potential in the power delivery circuit;

said first branch including a first series-connected semiconductor device;

said first branch including a second series-connected semiconductor device;

said first semiconductor device operating in a transimpedance mode and being controlled by a bias signal;

said second semiconductor device being cross-connected with said first semiconductor device to provide the respective said bias signal thereto;

a first node providing a signal approximately proportional to the main device current; and wherein said second semiconductor is connected in said second branch in a manner providing a bias signal for controlling said first semiconductor so as to result in said signal at said node being proportional to the main device current within a relatively small tolerance range across a relatively broad operating range.

13. A current detection circuit for use in combination with a current controlling device in a power delivery circuit for supplying load current to a load, the current controlling device being multicellular, with a major current-carrying cellular portion *including an output* and a minor current-carrying cellular portion *including an output*, a first main current terminal for connection to a source of power, a gate terminal for receiving a control signal, a second main current terminal connecting the major current-carrying cellular portion, a first auxiliary terminal connected at one end to the *output of the* minor current-carrying cellular portion so as to provide a current generally proportional to the main device current, and a second auxiliary terminal connected at one end to the *output of the* major current-carrying cellular portion, the current detection circuit comprising:

first and second branches each for connection at one end to a respective one of said first and said second auxiliary terminals and having means for connection in common at the other end to a reference potential in the power delivery circuit;

said first branch including a first bipolar transistor with its emitter and collector connected in series therein;

said second branch including a second bipolar transistor with its emitter and collector connected in series therein;

said first bipolar transistor operating in a transimpedance mode and being controlled by a bias signal;

said second bipolar transistor having its base shorted to its collector and cross-connected to the base of said first bipolar transistor to provide the respective said bias signal thereto; and said first branch further including impedance means connected in series circuit with said first bipolar transistor for providing a voltage approximately proportional to the main device current at a node at one end of said impedance means.

20. A power delivery circuit for supplying load current to a load comprising:

(a) a power node for connection to a source of electrical power;

(b) a load node for connection to a load;

(c) a high potential current path for supplying electrical current from the power node to the load node and including a current switch whose switching state is controlled by a control signal on an associated control terminal; said current [switching] *switch* having first and second main terminals, *wherein said first main terminal is connected to said power node, and said second main terminal is connected to said load node;* a first auxiliary terminal which produces a current which is a predetermined fraction of the total current in the high potential current path[,]; and a second auxiliary terminal connected to [one of the] *said second* main [terminals] *terminal* of the current switch;

(d) a current detection circuit responsive to an electrical condition of the high potential current path and being for detecting the current level in the high potential current path; the current detection circuit comprising:

(1) a first branch connected to one of said first and second auxiliary terminals and comprising a first semiconductive device;

(2) a second branch connected to the other of said first and second auxiliary terminals and comprising a second semiconductor device;

(3) said second semiconductor device being interconnected to said first semiconductor device in a current mirror configuration so as to maintain said first and second auxiliary terminals at substantially the same voltage; and (4) a first node providing a signal approximately proportional to load current.

31. A power delivery circuit for supplying load current to a load, comprising:

a power node for connection to a source of electrical power;

a load node for connection to a load;

a high potential current path for supplying electrical current from the power node to the load node and including a current switch whose switching state is controlled by a control signal on an associated control terminal; said current switch having first and second main terminals *wherein said first main terminal is connected to said power node, and said second main terminal is connected to said load node*, a first auxiliary terminal which produces a current which is a predetermined fraction of the total current in the high potential current path, and a second auxiliary terminal connected to [one of the] *said second* main [terminals] *terminal* of the current switch;

a current detection circuit responsive to an electrical condition of the high potential current path and being for detecting the current level in the high potential current path; the current detection circuit comprising one branch connected between one of the first and second auxiliary terminals and a ground and including a bias signal-controlled transimpedance device and another branch connected between the other of the first and second auxiliary terminals and the ground and providing a bias signal for the transimpedance device in the first branch, and a first node providing a signal approximately proportional to the main device current.

40. A power delivery circuit of the H-bridge type including:

a load leg having two end nodes and means to connect to a load;

a power means for connection to a source of electrical power for supplying current to the load; said power means having a first auxiliary terminal and a second auxiliary terminal; said first auxiliary terminal producing current which is a predetermined fraction of the total current through said power means, *said second auxiliary terminal connected to said load*;

a ground means for providing a path for returning load current to the source of electrical power;

a first current path for supplying load current through the load in a first direction comprising a first high potential leg connected between the power means and a first end node of the load leg, and a first low potential leg connected between a second end node of the load leg and the ground means; and a second current path for supplying load current through the load in a second direction comprising a second high potential leg connected between the power means and the second end node of the load leg, and a second low potential leg connected between the first end node of the load leg and the ground means;

the high and low potential legs each including a respective current switch whose switching state is controlled by a control signal on an associated control terminal;

the power delivery circuit further comprising first and second current detection circuits responsive to electrical conditions in the first and second high potential legs, respectively for detecting the current level in either of such legs;

each current detection circuit comprising one branch connected between one of the first and second auxiliary terminals and the ground means and including a bias signal-controlled transimpedance device and another branch connected between the other of the first and second auxiliary terminals and the ground means and providing a bias signal for the transimpedance device in the first branch and a first node providing a signal approximately proportional to the main device current.

\* \* \* \* \*